United States Patent [19]
Kubodera

[11] Patent Number: 6,147,482
[45] Date of Patent: Nov. 14, 2000

[54] METHOD FOR AND APPARATUS OF DETECTING AND DISPLAYING RADIATED NOISE

[75] Inventor: Tadashi Kubodera, Ebina, Japan

[73] Assignee: Fuji Xerox Co., Ltd., Tokyo, Japan

[21] Appl. No.: 09/103,504

[22] Filed: Jun. 24, 1998

[30] Foreign Application Priority Data

Jun. 26, 1997 [JP] Japan ................................. 9-170301

[51] Int. Cl.$^7$ ............................................ G01R 21/04
[52] U.S. Cl. ................................... 324/95; 324/613
[58] Field of Search ............................ 324/613, 614, 324/95, 359, 127; 343/703, 705

[56] References Cited

U.S. PATENT DOCUMENTS

| | | | |
|---|---|---|---|
| 4,263,549 | 4/1981 | Toppeto | 324/127 |
| 4,929,960 | 5/1990 | Kaylor et al. | 343/703 |
| 5,300,879 | 4/1994 | Masuda et al. | 324/95 |
| 5,371,508 | 12/1994 | Teich et al. | 343/703 |
| 5,430,456 | 7/1995 | Osburn et al. | 343/703 |
| 5,574,466 | 11/1996 | Reed et al. | 342/359 |
| 5,751,600 | 5/1998 | Ochi et al. | 364/524 |
| 5,825,331 | 10/1998 | Lee | 343/703 |

FOREIGN PATENT DOCUMENTS

| | | |
|---|---|---|
| 6-58969 | 3/1994 | Japan . |
| 6-58970 | 3/1994 | Japan . |
| 6-94763 | 4/1994 | Japan . |
| 6-130102 | 5/1994 | Japan . |

*Primary Examiner*—Safet Metjahic
*Assistant Examiner*—Vincent Q. Nguyen
*Attorney, Agent, or Firm*—Oliff & Berridge, PLC

[57] ABSTRACT

Noise detection devices are placed at arbitrary measurement points. A selection device switches the output of the noise detection devices and an analyzer analyzes the noise amount of the frequency component for each frequency band of radiated noise. A comparison device is made up of a storage section for storing measurement data provided by a plurality of the detection devices and a comparator, and finds a difference and a greater-than, equal-to, or less-than relationship between the noise amount analyzed by the analyzer and a predetermined value in a full band or at a specific frequency or a difference and a greater-than, equal-to, or less-than relationship between the noise amounts at two points. Output of the comparison device is displayed on a display device.

9 Claims, 9 Drawing Sheets

METHOD FOR AND APPARATUS OF DETECTING AND DISPLAYING RADIATED NOISE

BACKGROUND OF THE INVENTION

This invention relates to a radiated noise measurement apparatus and a radiated noise measurement method for measuring radiated noise generated from an electronic unit, etc., such as a product containing electronic parts for one or more printed circuit boards on which electronic parts are installed, on which measurement is to be made, a radiated noise display method, and a radiated noise detection apparatus.

A three-dimensional interference measurement apparatus described in the Unexamined Japanese Patent Application Publication Nos. Hei 6-58969, and Hei 6-58970 is proposed, for example, as an unnecessary radiated noise measurement apparatus on a printed-circuit board on which electronic parts are installed. It measures radiated noise generated from a printed-circuit board and comprises a plane sensor being placed in a table for detecting noise on an X-Y plane from the rear of the printed-circuit board and a magnetic field sensor being mounted on the printed-circuit board for measuring noise in the Z axis direction of the surface of the printed-circuit board.

The three-dimensional interference measurement apparatus makes measurement only on printed-circuit boards and cannot cover objects having a curved surface. Printed-circuit boards which provide full functions singly are few; generally many printed-circuit boards are configured to transfer a signal and power to and from other electronic parts or printed-circuit boards via a wire harness in input, output, power supply, etc. Radiated noise is classified into differential mode noise and common mode noise. The level of the common mode noise mainly caused by a high-frequency current flowing into a harness because of the potential difference between power supply and ground in a board or between boards in a system is far higher than the level of the differential mode noise generated due to board wiring, etc. Steps for decreasing the common mode noise are taken, thereby producing a large effect as countermeasures against noise. However, the above-described three-dimensional interference measurement apparatus cannot evaluate noise in the whole system.

In contrast, a radio wave source visualizing apparatus described in the Unexamined Japanese Patent Application Publication No. Hei 6-94763 adopts a method of finding reception output while moving a horizontally polarized wave reception antenna and a vertically polarized wave reception antenna in X-Y coordinates of an observation plane and comparing the reception output with reception output of a fixed antenna placed near the observation plane as a measurement method of unnecessary radiated noise generated from a product containing printed-circuit boards and electronic parts.

The method takes time in moving the horizontally polarized wave reception antenna and the vertically polarized wave reception antenna and inputting data and cannot deal with instantaneously occurring noise. Consideration is not given to an antenna moving method if the observation plane has a complicated curved face. Generally, there is an inverse square relationship between electric field strength and distance according to Coulomb's law and distance change causes an error to occur, thus the distance between the observation plane and measurement point needs to be made constant for making measurement.

FIG. 13 is a schematic representation of a conventional measurement method using a fixed antenna. In the figure, numeral 60 is a product provided for testing, numeral 61 is a turn table, numeral 62 is a direct wave, numeral 63 is a reflected wave, numeral 64 is a fixed antenna, numeral 65 is a switch section, numeral 66 is a receiver, and numeral 67 is a spectrum analyzer. The product 60 is placed on the turn table 61. While it is turned, noise is caught at the fixed antenna 64 and is measured with the receiver 66 or the spectrum analyzer 67 selected by means of the switch section 65. The distance between the product 60 and the fixed antenna 64 is 3 m or 10 m and further the effects of the direct wave 62 and the reflected wave 63 are received, thus fine evaluation cannot be performed. Since the rotation of the turn table on which the product is placed cannot be speeded up, the measurement method cannot deal with instantaneously occurring noise.

Thus, the above-described measurement system requires large-scale facilities and is expensive. In contrast, a method of connecting a non-contact high-frequency probe to a spectrum analyzer and making simple measurement is conducted generally. However, in this method, it is hard to keep the distance between the non-contact high-frequency probe and the spectrum analyzer constant and different data is provided each time measurement is made, namely, repeatability presents a problem.

Further, a problem common to the related arts is that if a radiated noise generation source can be located, a high-frequency current flow therefrom cannot be estimated. Therefore, to take countermeasures against noise, estimation of a cause from information provided by the conventional measurement system depends greatly on the technique proper to the engineer.

Since it takes time in evaluation at volume production, a sampling inspection is executed, but it is not guaranteed that unsampled ones of products varying in a wide range are within the specs; a 100 percent inspection is desired.

SUMMARY OF THE INVENTION

It is therefore an object of the invention to provide a radiated noise measurement apparatus and a radiated noise measurement method capable of measuring radiated noise stably without moving noise detection means and regardless of the shape of the measurement face and easily estimating a high-frequency current flow state at a specific frequency, a radiated noise display method, and a radiated noise detection apparatus.

To the end, according to the invention of aspect 1, there is provided a radiated noise measurement apparatus for measuring radiated noise generated from a unit on which measurement is to be made, the apparatus comprising a plurality of noise detection means being placed at arbitrary measurement points on the unit for detecting radiated noise on the unit, selection means for switching detection output from the noise detection means, and analysis means for analyzing a noise amount for each frequency component from the detection output selected by the selection means. Output from the noise detection means placed at arbitrary measurement points is switched at high speed by the selection means, whereby an instantaneous phenomenon of radiated noise can be measured and unlike the conventional measurement apparatus, measurement can be made without moving the noise detection means. The frequency characteristic at each measurement point can be measured easily and promptly through the analysis means from each noise detection means and the noise source position, high-frequency current magnitude, direction, etc., can be specified from the noise amount difference of a desired frequency component.

According to the invention of aspect 3, there is provided the radiated noise measurement apparatus of aspect 1, further comprising comparison means for detecting a difference between noise amounts for each frequency component at two measurement points.

According to the invention of aspect 4, there is provided the radiated noise measurement apparatus of aspect 1, further comprising comparison means for detecting a difference between noise amounts of a desired frequency component at two measurement points.

According to the invention of aspect 6, there is provided a radiated noise measurement method using a radiated noise measurement apparatus of aspect 3 or 4 to find a high-frequency current route in a desired frequency component from the noise amount difference of the desired frequency component. The flow direction of the high-frequency current in a desired frequency component can be known from the direction of the noise amount difference of the desired frequency component and the flow quantity of the high-frequency current in a desired frequency component can be known from the magnitude of the noise amount difference of the desired frequency component.

According to the invention of aspect 7, there is provided a radiated noise display method for displaying a difference between noise amounts for each frequency component at two measurement points on a unit on which measurement is to be made on a bar graph. The noise amount magnitude at each measurement point is easily distinguished and estimation of the noise generation source position is facilitated.

According to the invention of aspect 8, there is provided a radiated noise display method for displaying a noise amount of a desired frequency component at a plurality of measurement points on a unit on which measurement is to be made on a radar chart. Noise generation state comparison at each measurement point is facilitated from the area and shape of a radar chart.

According to the invention of aspect 9, there is provided a radiated noise display method comprising the steps of displaying a plurality of measurement point on a unit on which measurement is to be made at distributed positions and displaying on a line connecting the measurement points, a difference between noise amounts of a desired frequency component at the measurement points by a vector. The direction opposite to the vector direction is a direction in which the noise amount is large, and locating of the noise generation source position is facilitated.

According to the invention of aspect 10, there is provided a radiated noise detection apparatus comprising a minute antenna and attachment means to a measurement position of a unit on which measurement is to be made. The radiated noise detection apparatus comprises the attachment means, whereby measurement apparatus can be attached to an appropriate measurement position and radiated noise can be measured regardless of the shape of the unit on which measurement is to be made.

DETAILED DESCRIPTION OF THE DRAWINGS

Figure 1:
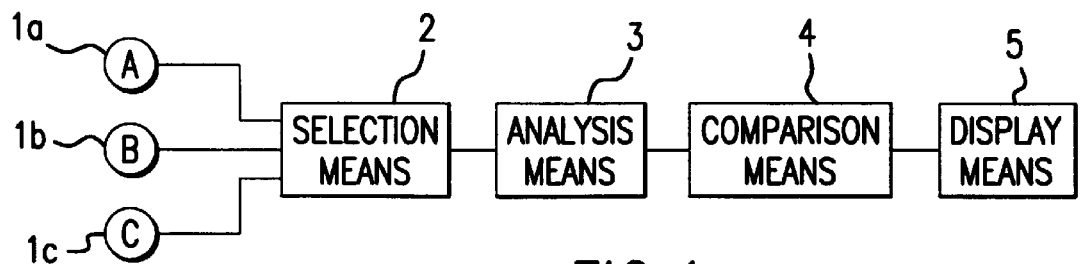
FIG. 1 is a schematic block diagram of one embodiment of a radiated noise measurement apparatus of the invention.

FIG. 1 is a schematic block diagram of one embodiment of a radianted noise measurement apparatus of the invention. In the figure, numerals 1*a*, 1*b*, and 1*c* are noise detection means, numeral 2 is selection means, numeral 3 is analysis means, numeral 4 is comparison means, numeral 5 is display means. The noise detection means 1*a*, 1*b*, and 1*c* are placed at arbitrary measurement points. The selection means 2 switches the detection means for selecting one of detection outputs. By switching the detection means at high speed, an instantaneous phenomenon of radiated noise can be measured. At this time, the noise detection means need not be moved. The analysis means 3 analyzes the noise amount of the frequency component for each frequency band of radiated noise and may use a spectrum analyzer. The comparison means 4 is made up of a storage section for storing measurement data provided by a plurality of the detection means and a comparator and finds a difference and greater-than, equal-to, or less-than relationship between the noise amount analyzed by the analysis means 3 and a predetermined value in a full band or at a specific frequency or a difference and greater-than, equal-to, or less-than relationship between the noise amounts at two points. Output of the comparison means 4 is displayed on the display means 5.

The comparison means 4 is not limited to means for comparing measurement data pieces provided by a plurality of the detection means. It may compare a preset reference amount with each of measurement data pieces provided by a plurality of the detection means. As the reference amount, a constant value not related to the frequency component may be set or a desired value may be set in response to the frequency component.

Appropriate means capable of producing visual display, such as a liquid crystal display, a CRT display, or a printer, can be used as the display means 5. If a noise generation source exists at a measurement point where the highest noise amount is detected or in the vicinity thereof, a display signal can be generated. Display can also be produced so that a high-frequency current route can be found from the difference between the noise amounts at measurement points.

Figure 2:
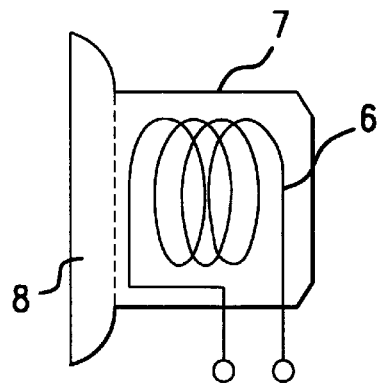
FIG. 2 is an illustration to show an example of noise detection means.

FIG. 2 shows an example of the noise detection means. In the figure, numeral 6 is a coil, numeral 7 is a case, and numeral 8 is an attraction part. If the coil 6 is directed to a radiated noise source, it generates an induction current because of change in the magnetic flux penetrating the coil. The case 7 is made of an elastic substance such as soft rubber or plastic for protecting the coil and providing stable contact at a measurement point and is formed at a tip with the attraction part 8. It may be an appropriate size; to use the case with a household electric machine as described below, a large coil about several mm to several ten mm in diameter can be made. To apply to a small device such as a small printed-circuit board, a minute coil several mm or less in diameter is used. The attraction part 8 is pressed against a measurement point and internal space is put into negative pressure for attaching the noise detection means; the attraction means is used as attachment means. If the attachment face at a measurement point is greatly uneven, adhesion means such as a pressure-sensitive adhesive is used as attachment means or may be used together with attraction means. A plurality of such noise detection means are used and are placed at any measurement points, whereby noise can be detected regardless of the form of the object.

FIG. 3 is a schematic representation of the noise measurement principle using the radiated noise measurement apparatus of the invention. In the figure, numerals 11 and 12 are metal plates, A, B, and C are measurement points, and R1, R2, and R3 are resistances equivalent to surface resistances between the measurement points. The measurement points A, B, and C are positions at which the noise detection means are placed. Circuitry is placed on the rear of the metal plate 11, 12. Of course, it may be placed on the surface or both the rear and surface. The metal plate 11, 12 need not be a uniform metal plate and may be circuitry placed on an insulating material like a printed-circuit board. It need not be like a plane and may be like a cube. However, in the example, metal plates are adopted for easy understanding. It can also be seen that a metal plate exists between measurement points equivalently. In fact, inductance and capacitance exist, thus the surface resistances R1–R3 may be seen as impedance rather than pure resistance.

Figure 3A:
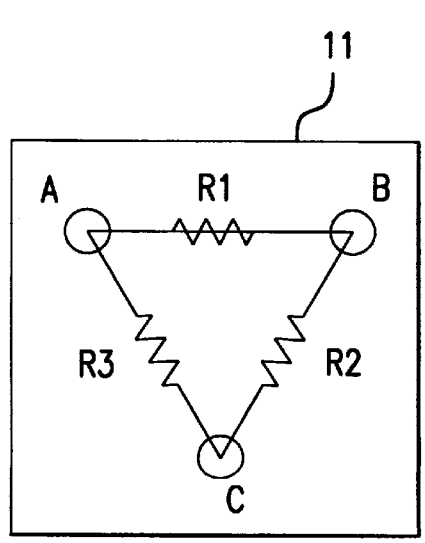
FIGS. 3A and 3B are schematic representations of the noise measurement principle using the radiated noise measurement apparatus of the invention.

In FIG. 3A, assuming that a noise source exists at the point nearest to the measurement point A, that the distance between the measurement points A and B, C is constant, and that R1 between A and B and R3 between A and C are constant, the potential at the measurement point B becomes lower than that at the measurement point A by i×R1 and the potential at the measurement point C becomes lower than that at the measurement point A by i×R3. Here, i is a high-frequency current flowing through the surface of the metal panel 11 uniformly from the measurement point A. In fact, a metal end exists at the side of the measurement point A, thus a reflected current must also be considered, but is not considered for simplicity. Therefore, noise observed at the measurement point B, C is lower than that at the measurement point A. Therefore, it can be seen that the high-frequency current flows from measurement point A to B and from measurement point A to C by comparing the measurement points A, B, and C with each other.

Figure 3B:
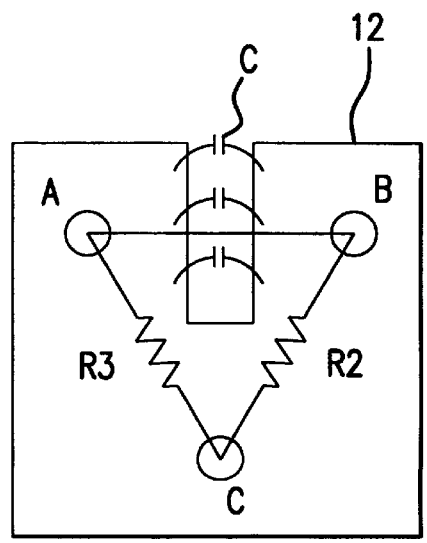

Next, the metal plate 12 with a slit between the measurement points A and B as shown in FIG. 3B is considered. The impedance between the measurement points A and B increases because of the effect of the slit and DC low-frequency band is bypassed to R3 and R2. As the frequency becomes high, the current attempts to flow through the shortest distance, thus a part arrives at the measurement point B owing to capacitance shown in the figure. Noise at the measurement point B becomes a characteristic with high-frequency band dropped because of capacitance as compared with noise at the measurement point A. Since the measurement point C receives only the effect of R3 as in FIG. 3A, the frequency characteristic becomes the same as that in FIG. 3A. Therefore, the three measurement points A, B, and C are observed, whereby what direction a noise current in which band flows in can be known.

Figures 4A, 4B:
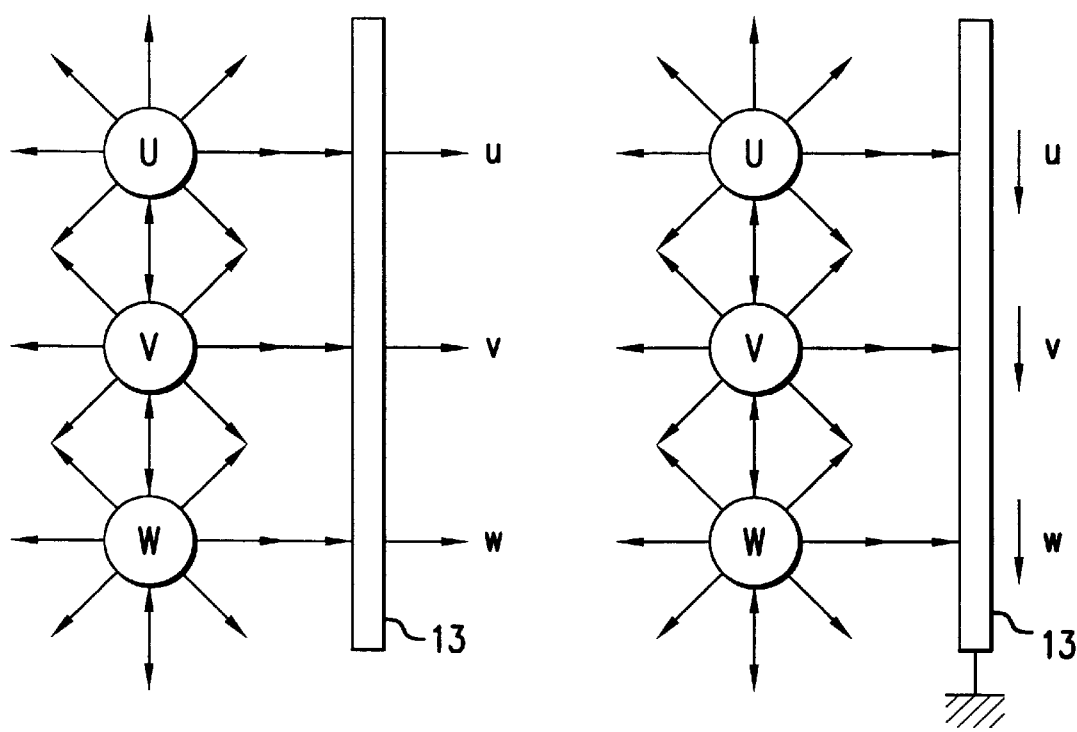
FIGS. 4A and 4B are schematic representations of a measurement principle to describe how a noise current flows depending on whether or not a metal plate is grounded.

FIG. 4A and FIG. 4B are schematic representations of a measurement principle to describe how a noise current flows depending on whether or not a metal plate 13 in the proximity of noise generation sources is grounded. In FIG. 4A, the metal plate 13 is not grounded and U, V, and W are noise generation sources. The surface of the metal plate receives the effect of the nearest noise generation source. Frequency u and its harmonic component are strongly radiated in the vicinity of the noise generation source U; frequency v and its harmonic component are strongly radiated in the vicinity of the noise generation source V; and frequency w and its harmonic component are strongly radiated in the vicinity of the noise generation source W. The metal plate, which is unipolarly charged, becomes the same potential on the surface and rear and if the metal plate 13 is not grounded, noise passes through the metal plate 13 and is radiated. A standing wave may be generated depending on the size of the metal plate and in fact the level of a specific frequency may rise because of resonance. This is why if a product contains a metal not grounded (if it is installed solely), the metal plate becomes a noise radiation source.

In the example in FIG. 4A, if the noise detection means are places at points corresponding to u, v, and w, the basic frequency and its harmonic component of each noise generation source are strongly observed and the effect of any other noise generation source is small.

In FIG. 4B, the metal plate 13 is grounded at one end. Radiation from the noise generation source U, V, W to the metal plate 13 is similar to that when the metal plate 13 is not grounded. However, when reaching the surface of the metal plate 13, a high-frequency current flows toward ground low in impedance. In this case, if the noise detection means are places at points corresponding to u, v, and w, for example, the frequency component of u is also detected at the points corresponding to v an w. How a current flows paying attention to the frequency of u can be easily found from the noise amount difference (u−v, u−w). The smaller the difference, the larger the high-frequency current flow. In this connection, in the example in FIG. 4A, the frequency component of u can be scarcely detected at the position corresponding to v, thus it can be judged that the noise amount difference (u−v, u−w) is large and that there is no noise escape route. In FIG. 4B, it can be judged that the noise amount difference (u−v, u−w) is small and that a large current flows. It can be seen that the current flows from u to v and from u to w because of the difference direction, namely, u−v>0 and u−w>0.

Figure 5:
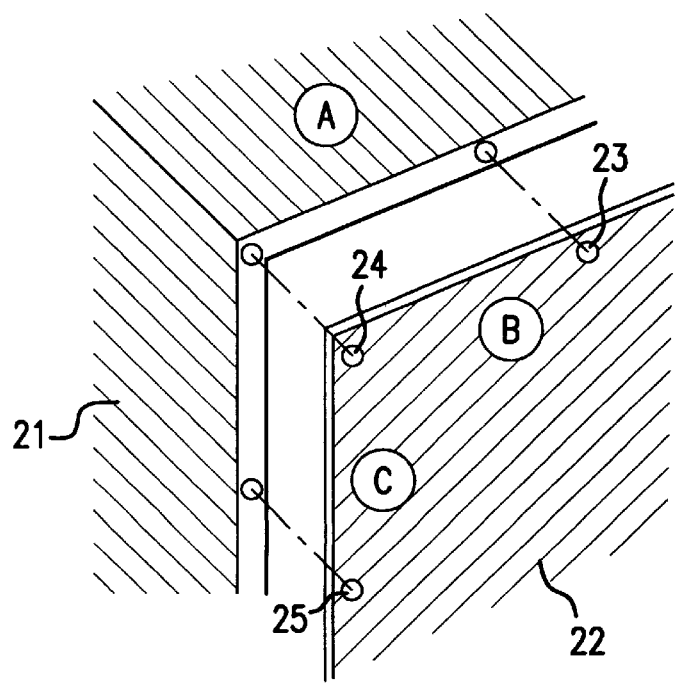
FIG. 5 is a schematic representation of an embodiment of the invention.

FIG. 5 shows an embodiment of the invention making full use of the principle. In the figure, numeral 21 is a cabinet, numeral 22 is a lid, numerals 23, 24, and 25 are attachment parts, and A, B, and C are measurement points. In the embodiment, the lid 22 is put on the cabinet 21 and a printed-circuit board, wiring, a power supply, and the like which become noise generation sources are installed in the cabinet 21. If the attachment parts 23, 24, and 25 of the lid 22 are attached insufficiently, noise leaks from the clearance between the cabinet 21 and the lid 22. The measurement point A is on the top of the cabinet 21, the measurement point B is at the upper part of the lid 22, and measurement point C is at the left part of the lid 22. In the embodiment, since the cabinet 21 has a lower ground potential, a difference between the noise amounts of the frequency components of detection output of noise detection means placed at the measurement point A and detection output of detection output of noise detection means placed at the measurement point B, C is found with the measurement point A as the reference. Preferably, the detection outputs of the noise detection means placed at the measurement points A, B, and C are the same potential in all frequency bands; however, the fact is that it is difficult to accomplish because of parts layout, contact resistance, etc.

First, the cabinet 21 and the lid 22 are aligned and are fixed with screws, then the noise detection means are placed at the measurement points A, B, and C. When the product is placed in an operation state, noise is generated from the printed-circuit board, etc., positioned in the periphery of the lid 22 and flows from the surface of the lid. 22 through the join parts of the cabinet 21 (containing the screwing parts) into the cabinet 21. However, as described above, as the frequency becomes high (the degree of the harmonic component grows), the capacitance at the join parts, the resistance value on the metal surface, and the like may adversely affect the current flow and noise is radiated from the part. Here, output from the noise detection means placed at the measurement point A is compared with output from the noise detection means placed at the measurement point B, C, whereby the join face (or attachment part) construction state can be grasped. If the number of attachment parts is increased and the number of screwing points is increased, contact resistance decreases and therefore it is ideal from the viewpoint of countermeasures against noise. However, workability of detachment and attachment at the assembling or maintenance time worsens accordingly. According to the evaluation method, optimization of screwing can also be judged easily.

Figure 6:
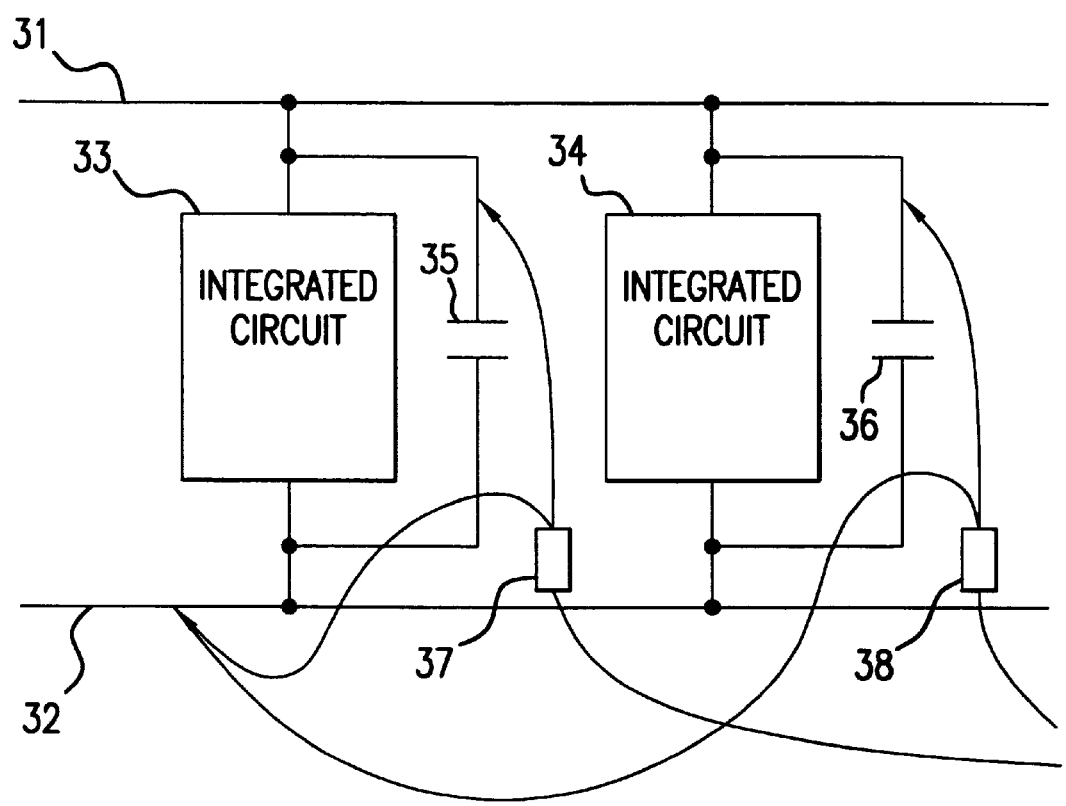
FIG. 6 is a schematic representation of another embodiment of the invention.

FIG. 6 is a schematic representation of another embodiment of the invention. In the figure, numeral 31 is a power supply, numeral 32 is ground, numerals 33 and 34 are integrated circuits, numerals 35 and 36 are bypass capacitors, and numerals 37 and 38 are noise detection means. A large number of integrated circuits are installed on a printed-circuit board. It is known that as the integrated circuits are speeded up, a through current flowing from the power supply 31 into the ground 32 increases, generating radiated noise. The bypass capacitors 35 and 36 are provided for preventing a voltage drop at the through current generation time, but may be unable to cover depending on the power consumption of the integrated circuit 33, 34 and radiated noise may appear on the outside. In the embodiment, attention is focused on the frequency component of noise contained in the power supply, ground in the periphery of the integrated circuit 33, 34. The noise detection means 37, 38 may be noise detection means using a minute coil as previously described with reference to FIG. 2. If further accuracy is required, a probe brought into contact with ground and a measurement point can be used. The probe is provided with attachment means of a clip mechanism, etc. If the probe is used, the noise component varies depending on the position at which the probe is grounded, thus the probe may be grounded at a common point as shown in FIG. 6 (part lowest in impedance, such as a power supply input part). Since probe ground becomes long, the material quality and the shape must be considered so as to lower the impedance of wire. Criteria as to whether or not the bypass capacitor value is optimum, as to whether or not the power or ground pattern impedance is high can be obtained as numeric data according to the noise amounts obtained with a number of probes.

Signal processing and a display method will be discussed. FIG. 7 shows an example of the noise level for each frequency component, provided by analyzing radiated noise at measurement points A, B, and C by a spectrum analyzer. If is a rectangular wave, a harmonic component contained in abrupt rise can be found by Fourier expansion. In the example, duty is 50%, the basic frequency is f0, its ternary harmonic is f1, quinary harmonic is f2, septenary harmonic is f3, and nonary harmonic is f4. The noise levels are shown in the vertical axis direction in terms of dB with respect to frequencies on the vertical axis. If the duty of a rectangular wave is not 50% (often, it does not become 50% in actual printed-circuit boards), even-degree harmonics such as a binary harmonic and a quad harmonic are also generated. In FIG. 7B and 7C, ' is added to frequency components of noise at the measurement point B and " is added to frequency components of noise at the measurement point C.

The noise amount for each frequency component of noise detected at one measurement point is compared with that detected at another measurement point and a difference therebetween is found. Comparison means detects f0-f0', f1-f1', . . . The comparison may be inverted like f0-f0', f1-f1', . . .

Figure 7A:
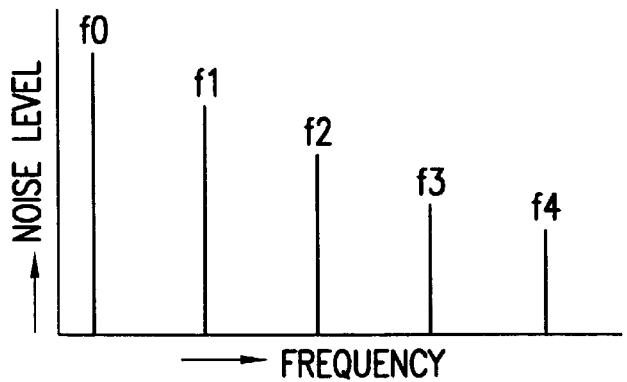
FIGS. 7A to 7C are schematic representations of an example of the noise level for each frequency component.
Figure 7B:
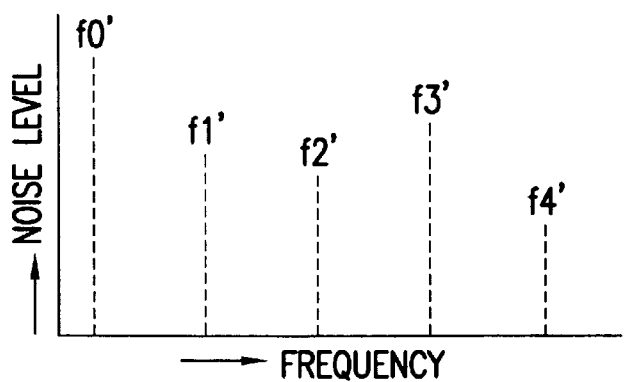
Figure 7C:
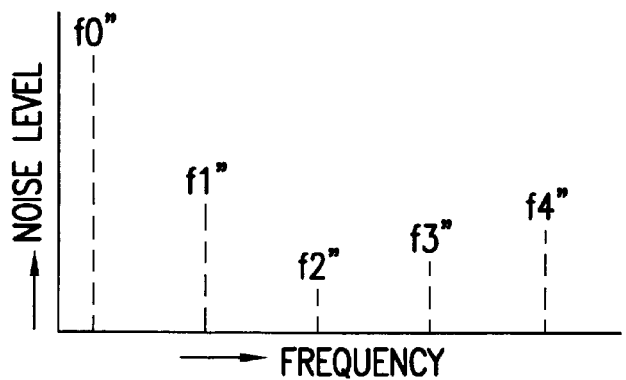
Figure 8A:
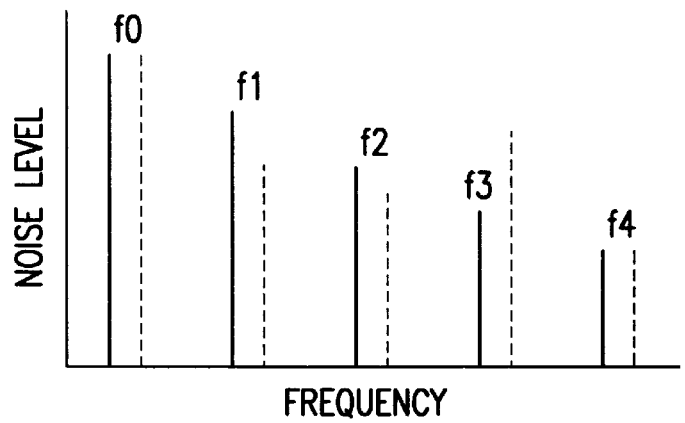
FIGS. 8A to 8C are schematic representations of an example of a noise level display method in the invention.
Figure 8B:
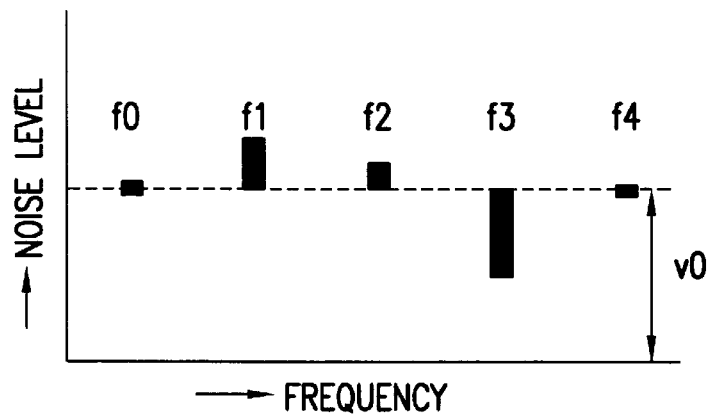

In FIG. 8A, the noise amounts for each frequency component at the measurement points A and B shown in FIG. 7A and 7B are shown side by side. Both are the same frequency components and thus are at the same position on the horizontal axis. However, they are shown in offset relation for easiness to see the graph. In FIG. 8B, a constant value v0 (reference point) is added to the noise amount difference for each frequency component and the result is displayed on display means. For example, display of f1 extends upward from the reference and thus it can be seen intuitively that the level at the measurement point A is higher than that at the measurement point B. The potential difference at the f1 frequency between the measurement points A and B is large and the high-frequency current of the frequency component indicates that the flow amount between the measurement points A and B is small. f0 and f4 are the same levels at both the measurement points A and B. Therefore, originally they need not be displayed, but may be displayed like small dots as in the example.

Figure 8C:
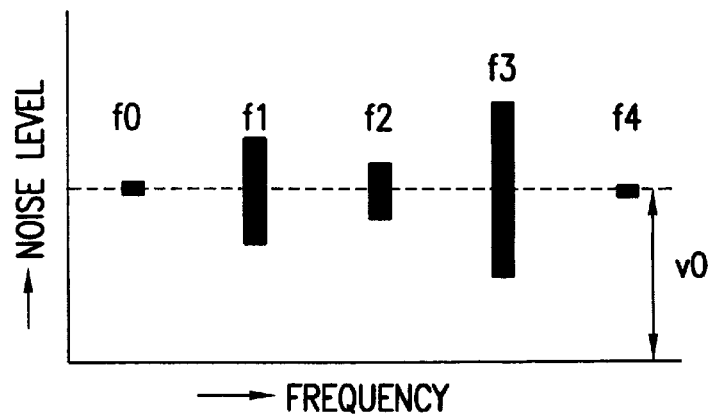

In FIG. 8B, the positive and negative of the difference from the constant value v0 are displayed upward and downward, but the absolute value of the difference may be displayed as shown in FIG. 8C, which is display like a bar graph extended evenly above and below the constant value v0.

In FIG. 8, the level comparison result between the two measurement points is displayed, but the levels at three or more measurement points can also be compared with each other for producing similar display.

Figure 9:
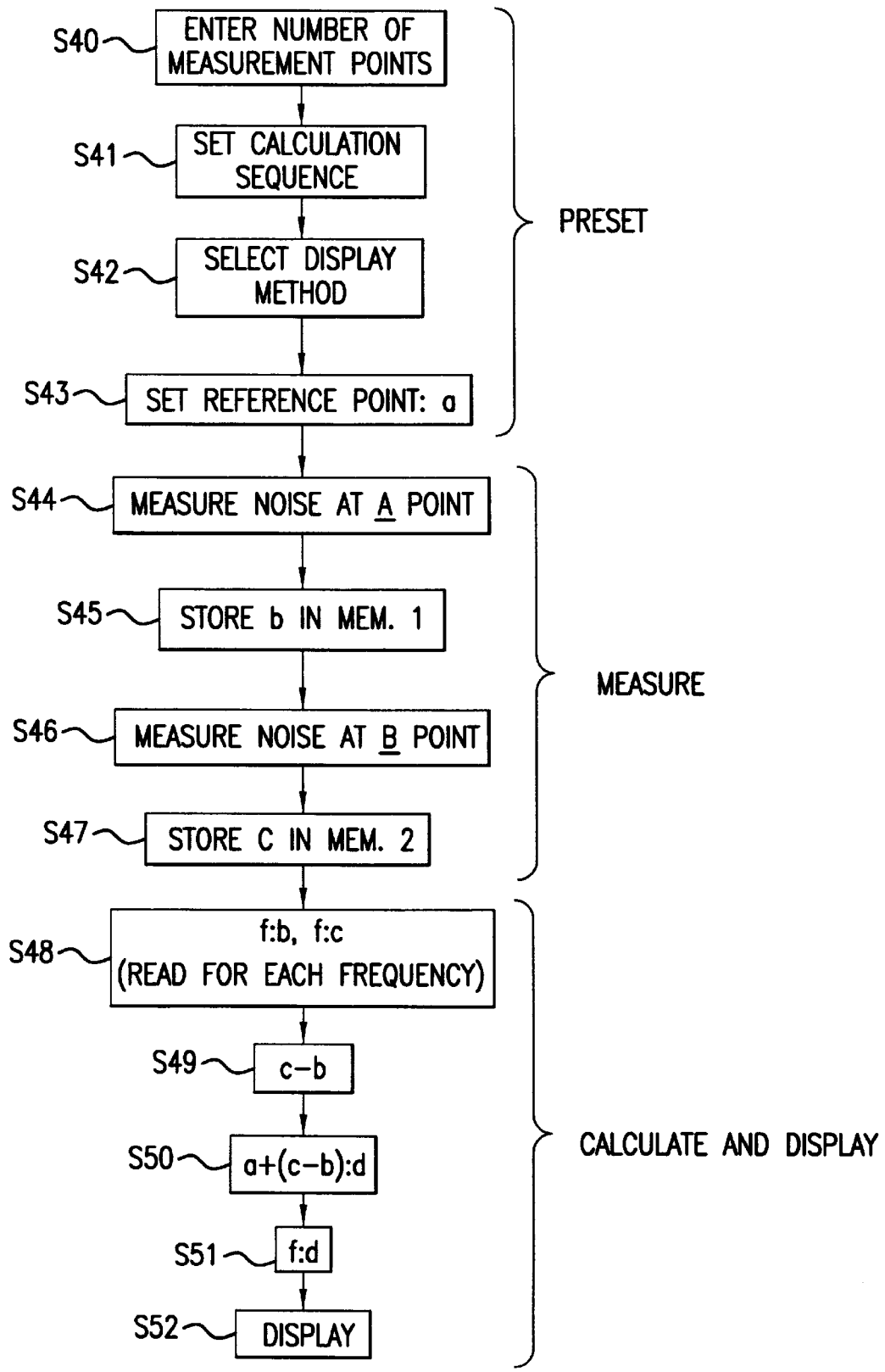
FIG. 9 is a flowchart example to describe the operation of producing display in FIG. 8B.

FIG. 9 is a flowchart example to produce display in FIG. 8B. The operator presets through an operation panel (not shown) in the radiated noise measurement apparatus previously described with reference to FIG. 1. The number of measurement points is entered at step S40 and a calculation sequence is set at step S41. A display method is selected at step S42 and a reference level is set at step S43. Assume that the bar graph display method in FIG. 8B is selected as the display method. Also, assume that the setup reference level is a. According to the measurement sequence, measurement point A is selected, detection output of the corresponding noise detection means is converted into a digital value, and the digital value is read at step S44 and is stored in memory 1 at step S45. Assume that the stored data is b. Next, measurement point B is selected, detection output of the corresponding noise detection means is converted into a digital value, and the digital value is read at step S46 and is stored in memory 2 at step S47. Assume that the stored data is c. Likewise, at another measurement point, similar operation is performed and data is stored at a predetermined memory address. To calculate and display, first the data b stored in the memory 1 is read, the noise amount for each frequency amount is calculated by the analysis means, and the result is stored in memory. Likewise, the data c stored in the memory 2 is read, the data for each frequency amount is calculated by the analysis means, and the result is stored in memory at step S48. Next, the noise amount difference for each frequency component is calculated by the comparison means at step S49, the reference level is added to the difference at step S50, and calculation result d at step S51 is displayed on the display means at S52.

The above-described display is bar graph display, but display is not limited to it and any other display method may be adopted. The noise amount for each frequency component is displayed with respect to a plurality of frequency components, but may be displayed with respect to a specific frequency component. On plane display, it is difficult to display the comparison result of levels at paired measurement points with respect to a plurality of frequency components on one graph or chart.

Then, a specific frequency component is selected and the comparison result of levels at a plurality of measurement points in the selected frequency component can be displayed. The flowchart in FIG. 9 can be used for presetting, measurement, and calculation.

Figure 10A:
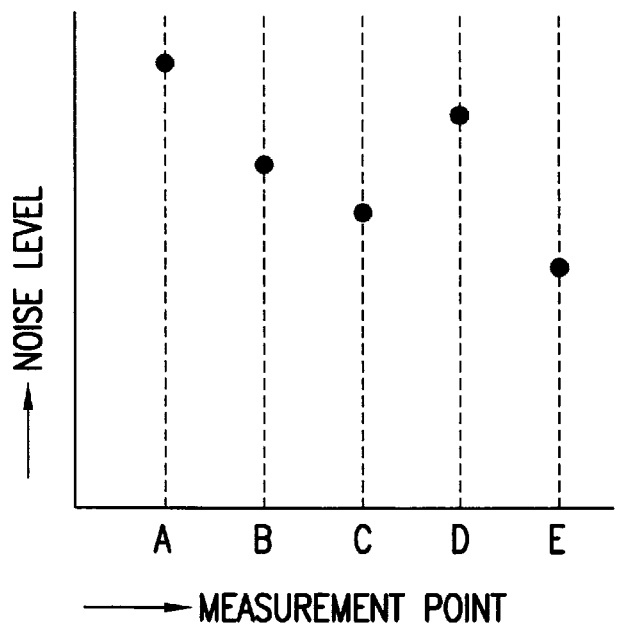
FIGS. 10A and 10B are schematic representations of an example of a noise amount display method at a plurality of measurement points in a specific frequency component.
Figure 10B:
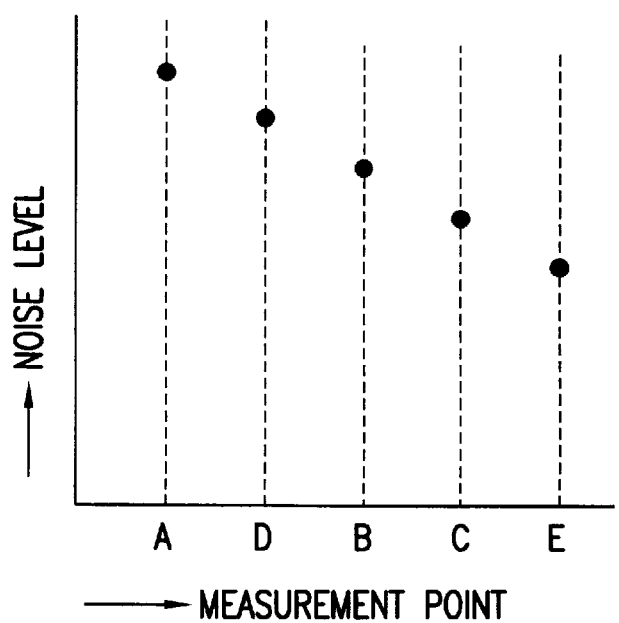

FIG. 10A shows a display method for a plurality of measurement points in a specific frequency component, for example, five measurement points A–E. In this display method, measurement points are entered on the horizontal axis and the noise level is entered on the vertical axis. Dot-like display is produced, but bar graph display may be adopted. The measurement point placement order may be adequate and is not related to the actual placement pattern of the noise detection means. As shown in FIG. 10B, display may be produced in the descending or ascending order of noise levels, as shown in FIG. 10B.

Figure 11A:
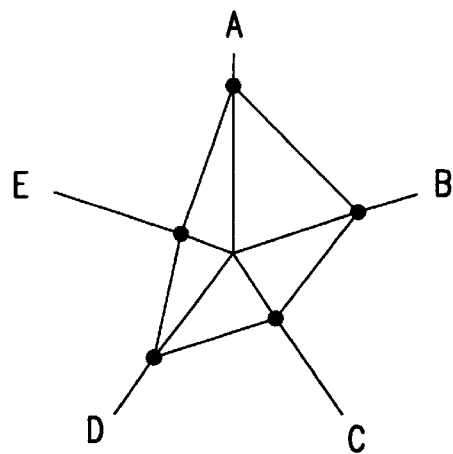
FIGS. 11A to 11C are schematic representations of a radar chart display method.
Figure 11B:
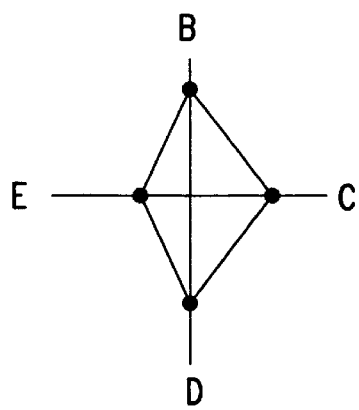
Figure 11C:
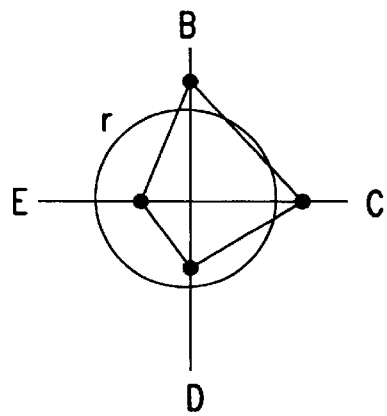

FIG. 11 shows a radar chart display method. In FIG. 11A, the noise levels of a specific frequency component at the measurement points A–E are positioned on radially extended lines and are connected by lines. The greater-than, equal-to, or less-than relationship between the noise levels and the imbalance are easy to understand. In FIG. 11B, the absolute values of the differences between the measurement point A as a reference point and the measurement points B–E are displayed on a radar chart. As shown in FIG. 11C, circle r indicating 0 level is displayed, the inside and outside thereof are related to the positive and negative, and the noise level differences between the measurement point A of a specific frequency component and the measurement points B–E may be displayed.

Figure 12:
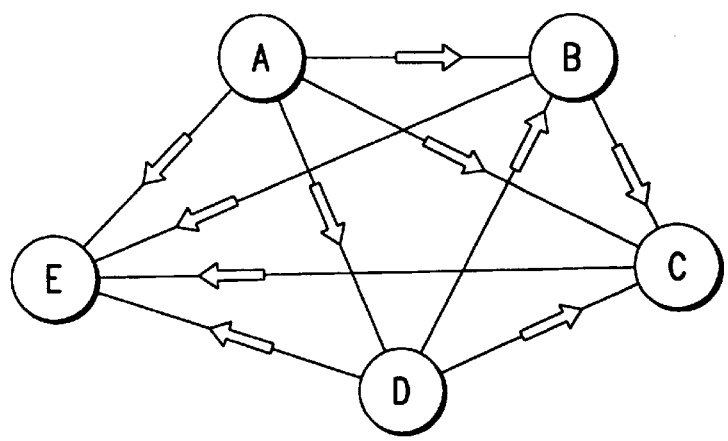
FIG. 12 is a schematic representation of an example of a display method of the noise level difference in a specific frequency component between the two of a plurality of measurement points.
Figure 13:
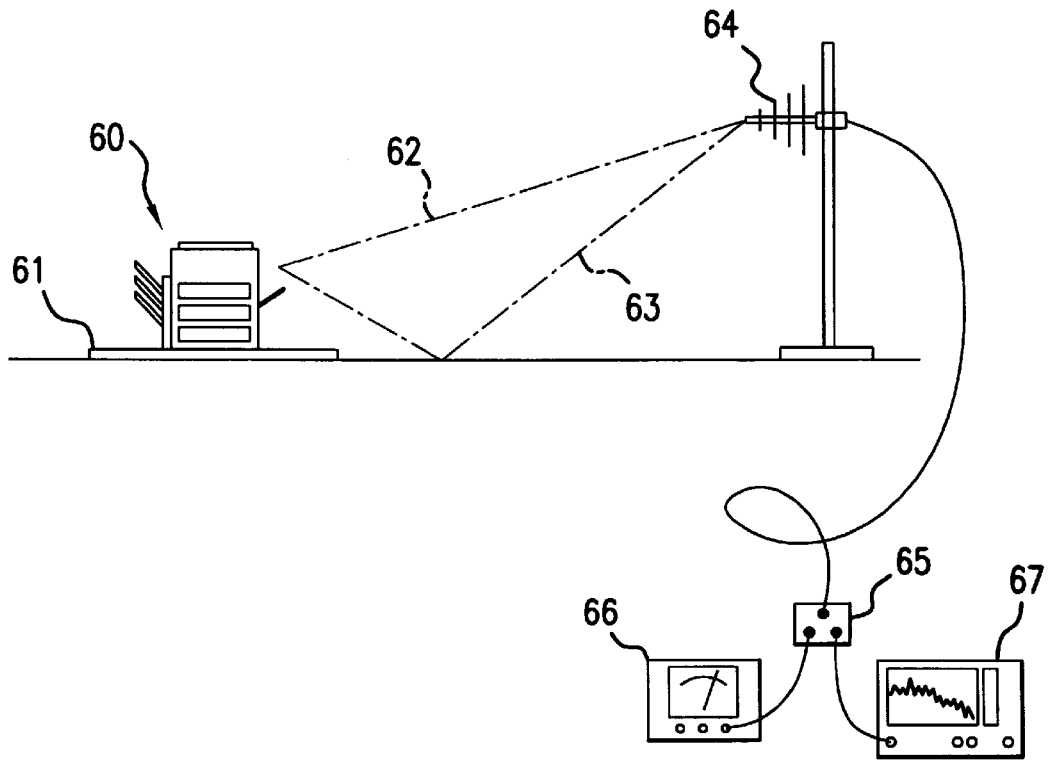
FIG. 13 is a schematic representation of a conventional measurement method using a fixed antenna.

FIG. 12 shows a display method of representing the noise level difference in a specific frequency component between the two of the measurement points A–E by a vector length. Vector direction is defined from the point at which the level is higher to the point at which the level is lower. The vector in the direction outgoing from each measurement point may be colored uniquely to the measurement point. In FIG. 12, all vectors from the measurement point A are in the arrow outgoing direction and thus it is seen that the level at the measurement point A is higher than the level at any other measurement point. Likewise, all vectors to the measurement point E are in the arrow incoming direction and thus the level at the measurement point E is lowest among the five measurement points. It can be determined that the larger the level difference, the higher the impedance at the specified frequency between the two points and the less the flowing current.

As seen from the description made so far, according to the invention of aspect 1, measurement can be made without moving the noise detection means and an instantaneous phenomenon of radiated noise can be measured. The frequency characteristic at each measurement point can be measured easily by a plurality of noise detection means and the noise source position, high-frequency current magnitude, direction, etc., can be specified from the noise amount difference.

According to the invention of aspect 6, the flow direction of the high-frequency current in a desired frequency component can be known from the direction of the noise amount difference of the desired frequency component and the flow quantity of the high-frequency current in a desired frequency component can be known from the magnitude of the noise amount difference of the desired frequency component. Thus, the noise generation source is easily estimated.

According to the invention of aspect 7, the noise amount magnitude at each measurement point is easily distinguished on a displayed bar graph and the noise generation source position is easily estimated.

According to the invention of aspect 8, noise generation state comparison at each measurement point is facilitated from the area and shape of a displayed radar chart.

According to the invention of aspect 9, locating of the noise generation source position is facilitated from the direction and size of a displayed vector.

According to the invention of aspect 10, the radiated noise detection apparatus can be attached to an appropriate position on a unit on which measurement is to be made, and radiated noise can be detected without receiving the effect of the shape, etc., of the unit on which measurement is to be made.

Thus, according to the invention, large-scale facilities are not required and the radiated noise generation state can be evaluated. The configuration is simple and can be easily placed online, thus the apparatus of the invention can also be applied to a 100 percent inspection.

What is claimed is:

1. A radiated noise measurement apparatus for measuring radiated noise generated from a unit on which measurement is to be made, said apparatus comprising:

a plurality of noise detection means being placed at arbitrary measurement points on the unit for detecting radiated noise on the unit, selection means for switching detection output from said noise detection means, and analysis means for analyzing a noise amount for each frequency component from the detection output selected by said selection means.

2. The radiated noise measurement apparatus of claim 1, further comprising:

comparison means for detecting a difference between a noise amount for each frequency component at one measurement point and a desired reference amount for each frequency component.

3. The radiated noise measurement apparatus of claim 2, further comprising:

display means for displaying output of said comparison means.

4. The radiated noise measurement apparatus of claim 1, further comprising:

comparison means for detecting a difference between noise amounts for each frequency component at two measurement points.

5. The radiated noise measurement apparatus of claim 4, further comprising:

display means for displaying output of said comparison means.

6. A radiated noise measurement method using a radiated noise measurement apparatus of claim 4 to find a high-frequency current route in a desired frequency component from a noise amount difference of the desired frequency component.

7. The radiated noise measurement apparatus of claim 1, further comprising:

comparison means for detecting a difference between noise amounts of a desired frequency component at two measurement points.

8. The radiated noise measurement apparatus of claim 7, further comprising:

display means for displaying output of said comparison means.

9. A radiated noise measurement method using a radiated noise measurement apparatus of claim 7 to find a high-frequency current route in a desired frequency component from a noise amount difference of the desired frequency component.

* * * * *